United States Patent [19]

Fuse et al.

[11] Patent Number: 4,861,729
[45] Date of Patent: Aug. 29, 1989

[54] METHOD OF DOPING IMPURITIES INTO SIDEWALL OF TRENCH BY USE OF PLASMA SOURCE

[75] Inventors: Genshu Fuse, Hirakata; Takashi Hirao, Kishiwada; Takashi Ohzone, Moriguchi, all of Japan

[73] Assignee: Matsushita Electric Industrial Co., Ltd., Osaka, Japan

[21] Appl. No.: 88,216

[22] Filed: Aug. 24, 1987

[51] Int. Cl.$^4$ .......................................... H01L 21/223
[52] U.S. Cl. ...................................... 437/18; 437/38; 437/60; 437/67; 437/165
[58] Field of Search ...................... 437/38, 40, 47, 52, 437/60, 67, 18, 165

[56] References Cited

U.S. PATENT DOCUMENTS

| | | | |
|---|---|---|---|
| 4,466,178 | 8/1984 | Soclof | 437/42 X |
| 4,688,064 | 8/1987 | Ogura et al. | 357/23.6 |
| 4,698,104 | 10/1987 | Barker et al. | 437/141 |

Primary Examiner—Olik Chaudhuri
Attorney, Agent, or Firm—Wenderoth, Lind & Ponack

[57] ABSTRACT

A method in which in order to dope impurities, with excellent controllability, into a sidewall of a trench formed in a semiconductor substrate, plasma is generated in a gas including the impurities and the semiconductor substrate is disposed in or near the plasma, so that the impurities may be doped into the sidewall of the trench uniformly and at high precision of concentration control; wherein one of a duluted $B_2H_6$ gas and diluted $AsH_3$ gas is chosen as the gas of the plasma, whereby one of B and As as the impurities directly enters the sidewall of the trench without first passing through a film.

6 Claims, 4 Drawing Sheets

METHOD OF DOPING IMPURITIES INTO SIDEWALL OF TRENCH BY USE OF PLASMA SOURCE

BACKGROUND OF THE INVENTION

This invention relates to a method of doping impurities uniformly into a sidewall and bottom of a trench formed in a semiconductor substrate.

By forming a trench in a semiconductor substrate, and doping impurities in its sidewall to form a part of a semiconductor device, the two-dimensional area can be utilized three-dimensionally, and a submicron device may be formed. So far, various methods have been proposed as a means of doping impurities into sidewall and bottom of a trench: for example, (i) the method of doping by ion implantation from above by obliquely forming a sidewall of trench (T. Shibata et al., IEDM Tech. Dig., pp. 27–30, Dec. 1983), (ii) the method of doping by using thermal diffusion by AsSG (K. Yamada et al., IEDM Tech. Dig., pp. 702–705, Dec. 1985), and (iii) the method of doping uniformly into a sidewall by ion implantation (G. Fuse et al., VLSI Symposium Dig. of Tech. Papers, pp. 58–59). However, these methods have their own disadvantages. First, in the case of forming a trench having a tapered sidewall and doping impurities by ion implantation, it is impossible to reduce width from a certain limit because of following limitations on depth and width. That is, the minimum trench width $W_I$ may be limited by $2D \tan \alpha$, where $D$ and $\alpha$ are trench depth and taper angle, respectively, so that, for example, $W_I$ is limited to be about 0.69 μm for $D=0.6$ μm and $\alpha=60°$. Therefore, it is impossible to use as a trench sidewall having a high aspect ratio. Next, concerning the method of using AsSG, since a thermal process is required, there may occur a problem as to mask material in doping selectively, and it may be impossible to control in low concentration impurity doping. Finally, in the doping method depending on tilt angle of implantation, since the shadow area cannot be doped with impurities by ion implantation, it is necessary to emit ion beams by rotating the substrate. Or, when implanting into the whole circumference of the sidewall, four-fold implantation is necessary by rotating the substrate by 90 degrees each. Furthermore, in ion implantation, since the directivity is very strong, the concentration in a bottom of a trench is extremely higher than that in a sidewall in the ion implantation into a trench having the vertical sidewall. It is hence difficult to dope uniformly into a trench for forming a trench capacitor of dynamic random access memory (D-RAM) or the like.

Recently plasma doping has been reported by Ishiwata et al. [O. Ishiwata, Y. Itoh, N. Sato, Y. Seki, K. Matsuzaki, and S. Ishida, Extended Abstracts (Spring Meeting, 1987; The Japan Society of Applied Physics), pp. 516] They doped impurities into Si at a relatively lower temperature of 200° C. and under the pressure of 2 torr for a DC glow discharge. However, in this report, too, impurity doping into the trench inner wall is not suggested.

SUMMARY OF THE INVENTION

This invention is, therefore, intended to dope impurities uniformly into a sidewall of a trench.

This invention is further intended to form a trench capacitor of D-RAM or the like at excellent controllability and in an easy process, by selectively forming a trench in a semiconductor substrate, disposing the substrate in or near the plasma of a gas including doping impurities, and uniformly doping the impurities on the entire surface of the sidewall and bottom of the trench; wherein one of a diluted $B_2H_6$ gas and diluted $AsH_3$ gas is chosen as the gas of the plasma, whereby one of B and As as the impurities directly enters the sidewall of the trench without first passing through a film.

DESCRIPTION OF THE PREFERRED EMBODIMENTS

Figure 1A:
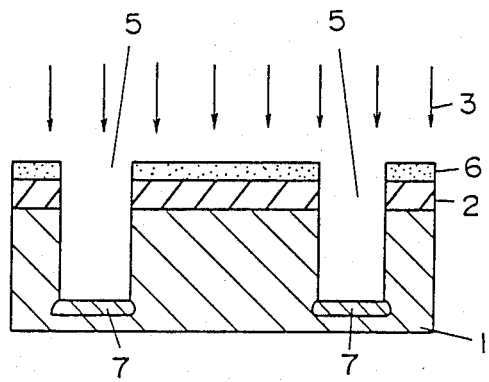
FIGS. 1A, 1B and 2 are sectional views to explain the doping method according to one of the embodiments of this invention.

The doping method in fabrication of a MOS type semiconductor integrated circuit having an isolation region in one of the embodiments of this invention is explained below with referring to FIGS. 1A and 1B. FIG. 1A, oxide film 2 is formed on p-type Si semi-conductor substrate 1, and photoresist 6 is left over by photolithography. Using photoresist 6 as mask, trench 5 for device isolation is formed by dry-etching oxide film 2 and substrate 1. From the above, boron (B) necessary as channel stopper is introduced by ion beam 3, by ion implantation of $1 \times 10^{13}$ cm$^{-2}$ at 25 keV by a beam vertical to the substrate, and channel stopper region 7 is formed. Then, in FIG. 1B, photoresist film 6 is removed. Afterwards, in plasma 8 of 1 torr diluted with, for example, $B_2H_6$, 10 ppm hydrogen, argon or helium as impurities, the sample (the substrate in FIG. 1A) placed on a cathode is left stand for 30 minutes so as to obtain an energy of approximately 1 keV. As a result, boron doping region 10 is formed in sidewall 9 of trench 5, and the surface boron concentration is about $10^{17}$ cm$^{-3}$, and by varying the forming condition of plasma 8, it has been found that the surface concentration can be controlled.

Figure 3:
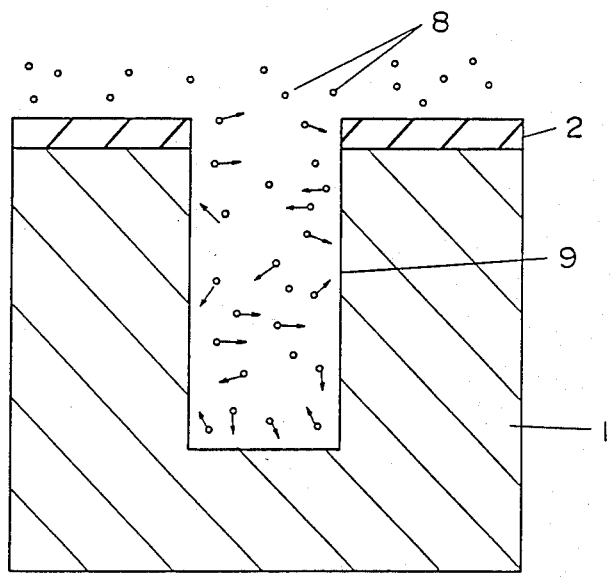
FIG. 3 is schematic sectional view to explain the principle of this invention.

As the property of plasma, as shown in FIG. 3, ions are facing in various directions, and the directivity is not so strong as in ion implantation, so that the impurities may be doped uniformly even into the vertical wall of a narrow trench. Incidentally, in the conventional process of doping from a doped oxide film into a silicon substrate by way of annealing process, control of native oxide (about 3 nm in thickness) is difficult, and it is extremely hard to dope at low concentration, and reproducibility is poor. In contrast, in the method of this invention, in spite of low energy, if a native oxide is formed inside the trench, the impurities are physically driven into the inner side, so that stable control of doped impurity concentration is possible even at low concentration.

Figure 1B:
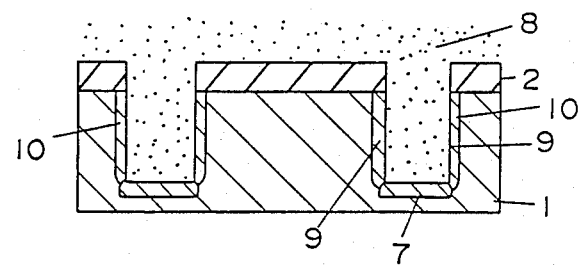
Figure 2:
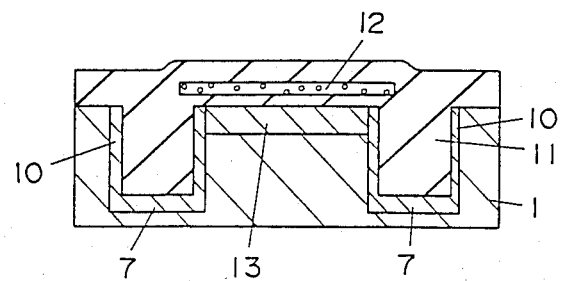

In FIG. 2, SiO film 11 is buried and formed inside the trench for isolation 4 formed in the process of FIGS. 1A and 1B to obtain an insulator for isolation, and a MOS transistor is formed in a specified position of substrate 1 in the vicinity thereof. Numeral 12 designates a polysilicon gate of MOS transistor, and 13 designates a channel region. In FIG. 2, source, drain region (not shown) are formed in the direction vertical to the sheet of paper of the drawing of this region 13. Usually, in an n-channel MOS transistor, concentration of electric field occurs in the portion of sidewall 9 of trench 5 at the end of channel region 13, and a parasitic MOS FET lower in threshold voltage than the FET in the middle of the channel region 13 is formed at this end, and a hump current flows. Therefore, by doping the boron in the entire region of sidewall 9 by the method of this invention mentioned above, the threshold voltage of the parasitic MOS FET at the end may be controlled nearly at the same level at that in the channel middle part, so that the hump current may be arrested.

Figure 4:
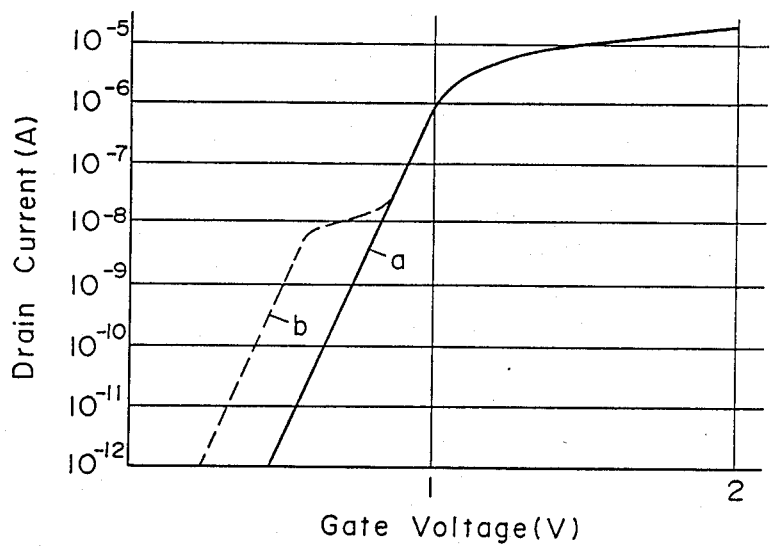
FIG. 4 shows the subthreshold current characteristic of a MOS transistor fabricated by the method of the same embodiment and a transistor fabricated by a conventional method.

FIG. 4 shows the subthreshold current characteristic (a) of a MOS transistor fabricated by the method of this invention, and the subthreshold characteristic (b) of a MOS transistor having a channel width of 10 $\mu$m and channel length of 10 $\mu$m fabricated by a process not including the step of FIG. 1B. The transistor fabricated by this invention is restricted in the socalled hump current width occurs in the characteristic of a transistor fabricated by the conventional method, and presents an excellent performance, which suggests a great effect of this invention.

Figure 5:
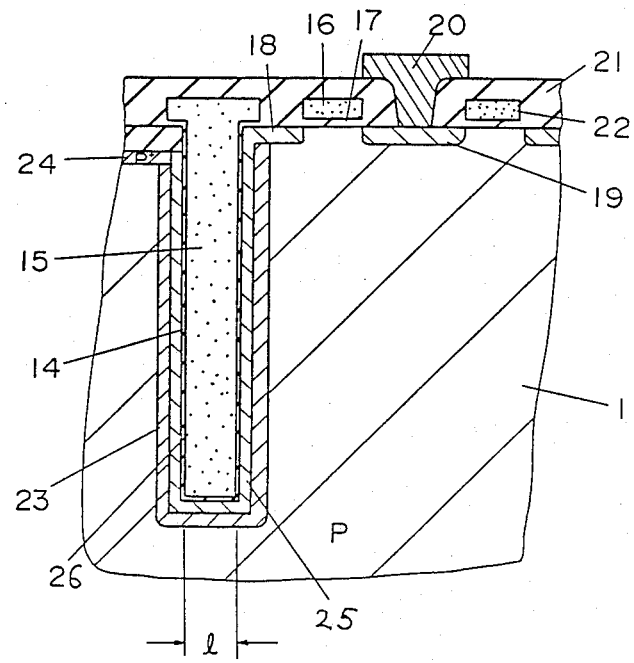
FIG. 5 is a sectional view of essential parts of a D-RAM possessing a trench capacitor fabricated according to this invention.

Next, by utilizing this invention, an example of fabricating a storage capacitor in a dynamic random access memory (D-RAM) is described below together with FIG. 5. In FIG. 5, numeral 1 designates a p-type Si semiconductor substrate, and 26 designates a trench for forming a capacitor, and recently its width l is a submicron size of, for example, 0.5 $\mu$m, and the depth is as much as 3 to 4 $\mu$m, and the aspect ratio is great. In the sidewall of this trench 26, As (arsenic) is doped. That is, plasma is formed by discharging in an AsH$_3$ gas at 1000 ppm diluted with hydrogen, argon, helium or the like. By disposing the substrate 1 in this plasma, an n$^+$-type electrode region (node) 25 with the maximum surface concentration of $10^{21}$ cm$^{-3}$ which is to become one of the electrodes of the capacitor is formed in the sidewall and bottom of the trench 26, that is, in the entire interior region of the trench. By this method, it has been confirmed to be sufficiently usable as the electrode of trench capacitor of D-RAM. Besides, in forming this region 25, by controlling the gas concentration and plasma power, it has been possible to control the impurity concentration in the order of $10^{17}$ cm.

Meanwhile, in FIG. 5, numeral 14 designates an SiO$_2$ film inside the trench, and 15 designates a polysilicon electrode buried in the trench, and it composes, together with SiO$_2$ film 14 and region 25, the capacitor. Numeral 16 designates a gate electrode, 17 designates a gate SiO$_2$ film, and 18, 19 designates source, drain region, which are combined to compose a MOS transistor for D-RAM, and a signal is read into the capacitor from word line 20, while a signal is read out into the line 20, too. Numeral 21 designates an insulation film, and 22 designates a gate electrode of MOS transistor for the adjacent memory cell. Numeral 24 designates a channel stop region. Numeral 23 designates a p$^+$-region, and by forming this region 23, a junction capacity formed together with the n$^+$-region 13 is added, so that the capacity of the capacitor may be increased by about 30%. This region may be formed either before or after the region 25, and it may be also formed by similar plasma doping as mentioned above, by diluting B$_2$H$_5$ gas with Ar, hydrogen or helium.

Figure 6:
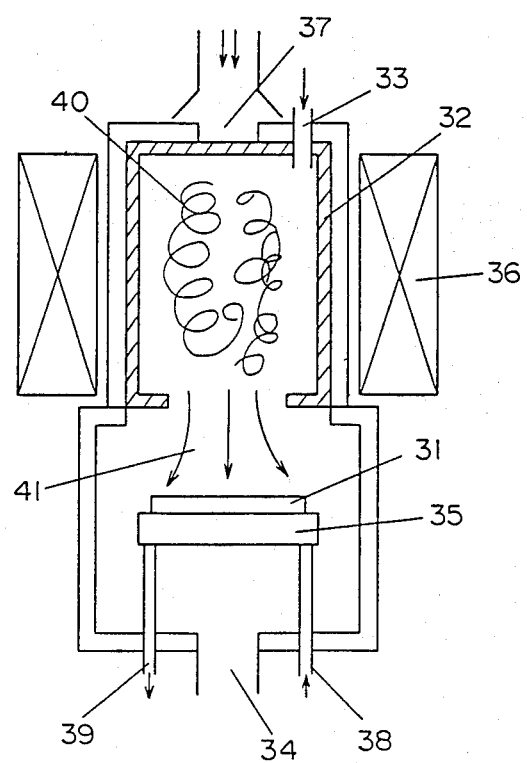
FIG. 6 shows a schematic structure of a plasma doping apparatus used in this invention.

FIG. 6 shows the schematic structure of a plasma doping apparatus used in this invention.

In FIG. 6, numeral 32 designates a quartz chamber, 33 designates a doping gas inlet, 34 designates an exhaust port, 35 designates a sample stand having a cooling mechanism, 31 designates a silicon wafer, 36 designates a coil for generating a magnetic filed, 37 designates a microwave inlet, 38 designates a cooling water inlet into the sample cooling mechanism, and 39 designates a cooling water outlet. When doping boron, gas containing boron, such as diborane B$_2$H$_6$ gas is introduced into the chamber 32 through the gas inlet 33. The inside of the plasma generating chamber 32 is made of quartz, which contributes to formation of plasma source, prevention of contamination of sample by sputtering of the chamber sidewall, and minimization of extinction of plasma on the radial wall surface. The inside of the chamber 32 is kept in the degree of vacuum of $5\times10^{-3}$ torr or higher by controlling the opening of the conductance valve to the exhaust system communicating with the exhaust port 34 and the flow rate of B$_2$H$_6$. Microwave of tens to hundreds of watts at frequency of 2.45 GHz is introduced from inlet 37, and the electrons in the magnetic field created by coil 36 (max. about 900 gauss) and in the plasma are nearly in the same state as in electron cyclotron resonance (ECR), and despite the high degree of vacuum, high density plasma 40 is produced. Then, plasma 40 is drawn out as plasma flow 41, and is emitted to wafer 31. The sample stand 35 is cooled by cooling water at about 0° C. to 30° C., and the substrate temperature is under 200° C. For cooling of sample stand 35, superpurified water of high insulation, or other high insulation liquid is used, and by electronic cooling or cooling by spraying He to the rear side of wafer 31, DC or RF bias may be applied to sample stand 35. Hence, the potential energy between the plasma and sample stand may be freely set.

In this invention, meanwhile, the semiconductor wafer may be pladed in the plasma, or in the plasma as the extracted plasma flow as shown in FIG. 6, or further in the vicinity of such plasma. Besides, DC plasma may be also used in this invention, and the frequency of high frequency plasma, substrate temperature, and subsequent heat treatment may be arbitrarily selected.

Thus, according to this invention, impurities may be doped easily and at excellent controllability even into the sidewall of a trench formed in the semiconductor substrate, which greatly contributes to fabrication of high density smeiconductor device.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim:

1. A method of doping impurities into a sidewall of a trench of a semiconductor substrate, comprising:
   selectively forming said trench in said semiconductor substrate;
   disposing said substrate in a plasma of a gas containing diluted doping impurities or in the vicinity of said plasma, and doping said impurities at least into the sidewall of said trench, wherein one of a diluted $B_2H_6$ gas and diluted $AsH_3$ gas is chosen as the gas of the plasma, whereby one of B and As as the impurities directly enters the sidewall of the trench without first passing through a film.

2. An impurity doping method as set forth in claim 1, wherein a channel stopper of an integrated circuit is formed in said sidewall by doping.

3. An impurity doping method as set forth in claim 1, wherein an insulator for device isolation is buried inside said doped trench.

4. An impurity doping method as set forth in claim 2, wherein said integrated circuit is composed of MOS integrated circuit.

5. A method of doping impurities into a semiconductor substrate comprising:

selectively forming a trench at a part of a negative conductive type semiconductor substrate;

forming one of electrode regions of a storage capacitor by doping impurities at least into sidewall of said trench by disposing said substrate in or near a plasma containing a diluted impurity gas of the opposite conductive type of said substrate; and forming a MOS transistor in a part of said substrate in the vicinity of said trench; wherein one of a diluted $B_2H_6$ gas and diluted $AsH_3$ gas is chosen as the gas of the plasma, whereby one of B and As as the impurities directly enters the sidewall of the trench without first passing through a film.

6. An impurity doping method as set forth in claim 5, wherein a region of the same conductive type as said substrate forms a junction capacity of said electrode region, in a part of the substrate in the trench.

* * * * *